United States Patent
Yoon et al.

(10) Patent No.: US 9,949,336 B2
(45) Date of Patent: **\*Apr. 17, 2018**

(54) ORGANIC LIGHT EMITTING DIODE DEVICE HAVING ELECTRODE WITH AG—MG ALLOY

(71) Applicant: SAMSUNG DISPLAY CO., LTD., Yongin-si, Gyeonggi-Do (KR)

(72) Inventors: Seok-Gyu Yoon, Yongin (KR); Dong Chan Kim, Gunpo-si (KR); Sung Chul Kim, Seongnam-si (KR); Won Jong Kim, Suwon-si (KR); Eung Do Kim, Seoul (KR); Young Woo Song, Suwon-si (KR); Jong Hyuk Lee, Seoul (KR); Bo Ra Jung, Seongnam-si (KR); Kyu Hwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/773,552

(22) Filed: Feb. 21, 2013

(65) Prior Publication Data
US 2014/0035457 A1 Feb. 6, 2014

(30) Foreign Application Priority Data
Aug. 2, 2012 (KR) ........................ 10-2012-0084974

(51) Int. Cl.
*H01L 51/54* (2006.01)
*H05B 33/28* (2006.01)
(Continued)

(52) U.S. Cl.
CPC ......... *H05B 33/28* (2013.01); *H01L 51/5092* (2013.01); *H01L 51/5234* (2013.01); *H05B 33/26* (2013.01)

(58) Field of Classification Search
CPC .......... H01L 51/5072–51/508; H01L 51/5092; H01L 51/5203; H01L 51/5206;
(Continued)

(56) References Cited

U.S. PATENT DOCUMENTS 5,952,779 A * 9/1999 Arai et al. ................... 313/504
6,130,001 A * 10/2000 Shi et al. ....................... 428/690
(Continued)

FOREIGN PATENT DOCUMENTS

CN 101044642 A 9/2007
CN 101661949 A 3/2010
(Continued)

OTHER PUBLICATIONS

Machine translation of JP 2009-301858, retrieved on Feb. 2, 2017.*
(Continued)

*Primary Examiner* — Anh Mai
*Assistant Examiner* — Steven Horikoshi
(74) *Attorney, Agent, or Firm* — Lewis Roca Rothgerber Christie LLP

(57) ABSTRACT

An organic light emitting diode device includes a first electrode, a second electrode opposite the first electrode, and an emission layer between the first and second electrodes. The first electrode includes a Ag—Mg alloy including a greater amount of Ag than Mg.

13 Claims, 7 Drawing Sheets

(51) Int. Cl.
*H05B 33/26* (2006.01)
*H01L 51/52* (2006.01)
*H01L 51/50* (2006.01)

(58) Field of Classification Search
CPC .................. H01L 51/5212–51/5221; H01L 51/5228–51/5234; H05B 33/26; H05B 33/28
See application file for complete search history.

(56) References Cited

U.S. PATENT DOCUMENTS

| | | | |
|---|---|---|---|
| 6,280,860 | B1 | 8/2001 | Ueda et al. |
| 6,281,627 | B1 | 8/2001 | Arai et al. |
| 6,734,622 | B1 | 5/2004 | Kanitz et al. |
| 8,415,874 | B2 * | 4/2013 | Song et al. ............ 313/504 |
| 2002/0127431 | A1 * | 9/2002 | Ueda et al. ............ 428/690 |
| 2005/0099113 | A1 * | 5/2005 | Yamada ............... 313/504 |
| 2005/0162075 | A1 * | 7/2005 | Madathil ....... H01L 51/5088 313/504 |
| 2005/0168137 | A1 | 8/2005 | Adamovich et al. |
| 2005/0225232 | A1 * | 10/2005 | Boroson ....... H01L 51/5265 313/504 |
| 2006/0022587 | A1 * | 2/2006 | Jeong et al. ............ 313/504 |
| 2006/0121313 | A1 | 6/2006 | Lee et al. |
| 2006/0125376 | A1 | 6/2006 | Ghosh et al. |
| 2006/0154107 | A1 | 7/2006 | Kubota et al. |
| 2006/0175966 | A1 * | 8/2006 | Yamada ......... H01L 27/322 313/506 |
| 2006/0186792 | A1 * | 8/2006 | Lee et al. ............. 313/503 |
| 2007/0164666 | A1 * | 7/2007 | Oosono et al. ......... 313/504 |
| 2008/0157663 | A1 * | 7/2008 | Sung ............ H01L 51/5234 313/504 |
| 2008/0258612 | A1 * | 10/2008 | Kim et al. ............. 313/504 |
| 2009/0102358 | A1 * | 4/2009 | Shimoji et al. ......... 313/504 |
| 2010/0051973 | A1 * | 3/2010 | Kobayashi ..... H01L 51/5092 257/88 |
| 2010/0117517 | A1 * | 5/2010 | Cok et al. ............. 313/503 |
| 2010/0301741 | A1 | 12/2010 | Kim et al. |
| 2011/0134020 | A1 * | 6/2011 | Jeong et al. ............ 345/82 |
| 2011/0309739 | A1 * | 12/2011 | Song ............. H01L 51/5088 313/504 |

FOREIGN PATENT DOCUMENTS

| | | |
|---|---|---|
| CN | 103022377 A | 4/2013 |
| JP | 04-028197 A | 1/1992 |
| JP | 10-125469 A | 5/1998 |
| JP | 2000-215983 | 8/2000 |
| JP | 2003-109775 A | 4/2003 |
| JP | 2007-035432 A | 2/2007 |
| JP | 2008-116825 | 5/2008 |
| JP | 2008-166283 A | 7/2008 |
| JP | 2009-054710 | 3/2009 |
| JP | 2009-301858 A | 12/2009 |
| JP | 2010-055919 A | 3/2010 |
| JP | 2010-153365 A | 7/2010 |
| JP | 2010-278003 A | 12/2010 |
| JP | 2011-119246 A | 6/2011 |
| JP | 2012-004116 A | 1/2012 |
| JP | 2012-018899 A | 1/2012 |
| KR | 10-2001-0109321 | 12/2001 |
| KR | 10-2006-0062556 | 6/2006 |
| KR | 10-2007-0020467 A | 2/2007 |
| KR | 10-0766947 B1 | 10/2007 |
| KR | 10-2007-0114720 A | 12/2007 |
| KR | 10-2008-0061732 A | 7/2008 |
| KR | 10-2008-0102576 | 11/2008 |
| KR | 10-2009-0047158 | 5/2009 |
| KR | 10-2011-0065078 | 6/2011 |
| KR | 10-2012-0042051 A | 5/2012 |
| TW | 201218374 A1 | 5/2012 |
| WO | WO 2006/132226 A1 | 12/2006 |

OTHER PUBLICATIONS

Ward, Optical Constants of Eight Rare Earth Elements: (Ce), (Sm), (Gd), (Tb), (Dy), (Er), (Tm), and (Yb), 1998, article of Ward part of book: Palik, Handbook of Optical Constants of Solids, 1998, Academic Press, vol. 3, pp. 287-340, retrieved from Science Direct website on Jun. 30, 2017.*
U.S. Office action dated Aug. 6, 2012, for cross reference U.S. Appl. No. 13/043,371, (11 pages).
Korean Patent Abstracts, and English machine translation of Korean Publication 1020080102576 dated Nov. 26, 2008, listed above, (16 pages).
Chinese Office action for Chinese Patent Application No. 201310179780.6 dated Jun. 28, 2016, 11 pages.
JPO Office Action dated Aug. 2, 2016, for corresponding Japanese Patent Application No. 2012-238801 (7 pages).
TIPO Office Action dated Aug. 8, 2016, for corresponding Taiwanese Patent Application No. 102110668 (5 pages).
Lai, S.L. et al., "Applications of Ytterbium in organic light-emitting devices as high performance and transparent electrodes," Chemical Physics Letters, 2002, vol. 366, pp. 128-133.

* cited by examiner

ORGANIC LIGHT EMITTING DIODE DEVICE HAVING ELECTRODE WITH AG—MG ALLOY

CROSS-REFERENCE TO RELATED APPLICATION

This application claims priority to and the benefit of Korean Patent Application No. 10-2012-0084974, filed in the Korean Intellectual Property Office on Aug. 2, 2012, the entire contents of which are incorporated herein by reference.

BACKGROUND

1. Field

Embodiments of the present invention are directed to an organic light emitting diode device.

2. Description of the Related Art

Recently, there has been a desire for reduced size and thickness of a monitor, a television, or the like, and this desire has prompted replacement of a cathode ray tube (CRT) with a liquid crystal display (LCD). However, the liquid crystal display (LCD) does not only need a separate backlight (as it is a non-emissive device) but has also a limit in terms of response speed, viewing angle, and the like.

Recently, these disadvantages have been expected to be overcome by an organic light emitting diode device (OLED) display. In general, an organic light emitting diode device includes two electrodes and an emission layer disposed therebetween. An OLED display emits a light when electrons injected from one electrode are combined with holes injected from the other electrode, forming excitons, which results in a release of energy.

At least one of the two electrodes is a transparent electrode that externally transmits light. Accordingly, optical properties of the electrodes may have an influence on efficiency of the organic light emitting diode device.

SUMMARY

Aspects of embodiments of the present invention are directed to an organic light emitting diode (OLED) device including an electrode having high transmittance and a low absorption ratio.

According to one embodiment, an organic light emitting diode device includes a first electrode, a second electrode opposite the first electrode, and an emission layer between the first electrode and second electrode. The first electrode includes a silver (Ag)-magnesium (Mg) alloy including a greater amount of Ag than Mg.

The Mg may be included in an amount of less than or equal to about 30 volume % based on the total volume of the Ag—Mg alloy.

The Mg may be included in a range of about 5 volume % to about 30 volume % based on the total volume of the Ag—Mg alloy.

The first electrode may further include ytterbium (Yb).

The Yb may be included in an amount of less than or equal to about 30 volume % based on the total volume of the Ag—Mg alloy.

The Yb may be included in in a range of about 5 volume % to about 30 volume % based on the total volume of the Ag—Mg alloy.

The first electrode may have a thickness of about 30 Å to about 300 Å.

The organic light emitting diode device may further include a Yb-containing auxiliary layer between the first electrode and emission layer.

The auxiliary layer may have a thickness in a range of about 5 Å to about 50 Å.

The first electrode may have a light transmittance of greater than or equal to about 60% in a wavelength region of about 450 nm to about 750 nm.

The first electrode may have a light transmittance in a range of about 60% to about 85% in a wavelength region of about 450 nm to about 750 nm.

The first electrode may have a light reflectance of less than or equal to about 40% in a wavelength region of about 450 nm to about 750 nm.

The first electrode may have a light absorption of less than or equal to about 15% in a wavelength region of about 450 nm to about 750 nm.

The second electrode may be a reflective electrode, and the emission layer may be configured to emit white light.

The second electrode may be a transparent electrode, and the emission layer may be configured to emit white light.

The first electrode may be a cathode.

DETAILED DESCRIPTION

Figure 1:
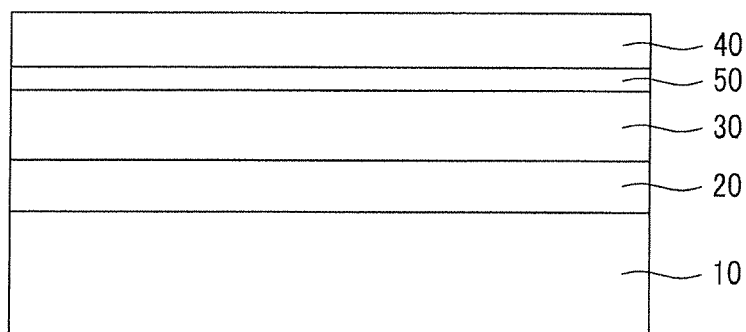
FIG. 1 is a cross-sectional view depicting an organic light emitting diode device according to one embodiment.

The present disclosure will be described more fully hereinafter with reference to the accompanying drawings, in which exemplary embodiments of this disclosure are shown. This disclosure may, however, be embodied in many different forms and is not construed as limited to the exemplary embodiments set forth herein.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, Referring to FIG. 1, an organic light emitting diode device will be described in accordance with an embodiment.

FIG. 1 is a cross-sectional view showing an organic light emitting diode device according to one embodiment.

Referring to FIG. 1, the organic light emitting diode device according to one embodiment includes a substrate 10, a lower electrode 20, an upper electrode 40 facing (e.g., opposite) the lower electrode 20, and an emission layer 30 interposed between the lower electrode 20 and the upper electrode 40.

The substrate 10 may be made of, for example, an inorganic material such as glass; an organic material such as polycarbonate, polymethylmethacrylate, polyethyleneterephthalate, polyethylenenaphthalate, polyamide, polyethersulfone, or a combination thereof; a silicon wafer; or the like.

One of the lower electrode 20 and the upper electrode 40 is a cathode, and the other is an anode. For example, the lower electrode 20 may be an anode, and the upper electrode 40 may be a cathode.

At least one of the lower electrode 20 or the upper electrode 40 may be a transparent electrode. When the lower electrode 10 is a transparent electrode, an organic light emitting diode device may be a bottom emission type in which light is transmitted toward the substrate 10. When the upper electrode 40 is a transparent electrode, the organic light emitting diode device may be a top emission type in which light is transmitted opposite the substrate 10. In addition, when the lower electrode 20 and upper electrode 40 are both transparent, light may be transmitted both toward the substrate 10 and opposite the substrate 10.

The transparent electrode may include a Ag—Mg alloy.

Ag is a metal having high electrical conductivity and a low light absorption and thus, provides improved electrical properties and optical properties. Mg is a metal having a low work function and thus, may provide improved charge mobility and increase strength of a thin electrode film, resultantly improving reliability.

Herein, the Ag—Mg alloy may be an Ag-rich alloy, in which Ag is present in a greater amount than Mg.

Mg may be included in an amount of less than or equal to 30 volume % based on the total volume of the Ag—Mg alloy. In one embodiment, Mg may be included in an amount ranging from about 0.001 volume % to about 30 volume % based on the total volume of the Ag—Mg alloy. In some embodiments, when Mg is included within the above described range, efficiency of an organic light emitting diode device is improved by increasing light transmittance but decreasing light absorption as well as securing stability of a thin electrode film.

In some embodiments, Mg may be included in an amount of about 5 volume % to about 30 volume % based on the total volume of the Ag—Mg alloy. In some embodiments when Mg is included within the above described range, a Ag—Mg alloy is easily formed and efficiency of an organic light emitting diode device using the alloy is also improved.

The transparent electrode may further include ytterbium (Yb). Yb may have a relatively low work function and easily inject electrons into the emission layer 30 and also, may have a low light absorption in a visible ray region and thus, may improve light transmittance of the transparent electrode.

Yb may be included in an amount of less than or equal to 30 volume % based on the total volume of the Ag—Mg alloy. In some embodiments, Yb may be included in an amount of about 5 volume % to about 30 volume % based on the total volume of the Ag—Mg alloy. In some embodiments, when Yb is included within this range, a driving voltage may be lowered by smoothly injecting electrons as well as maintaining stability of a thin electrode film.

The transparent electrode may have a thickness of about 30 Å to about 300 Å. In some embodiments, when the transparent electrode has a thickness within this range, high light transmittance and low resistance characteristic are concurrently secured.

The transparent electrode may have light transmittance of greater than or equal to about 60% in a wavelength region of about 450 nm to about 750 nm. In some embodiments, the transparent electrode may have light transmittance of about 60% to about 85% in a visible ray region, that is, in a wavelength region of about 450 nm to about 750 nm.

The transparent electrode may have a light reflectance of less than or equal to about 40% in a wavelength region of about 450 nm to about 750 nm, and may have a light reflectance ratio of less than or equal to about 15% in the wavelength region of about 450 nm to about 750 nm. In this way, when the transparent electrode has a relatively low light reflectance and a relatively low light absorption, efficiency of externally transmitting light may be increased.

When the lower electrode 20 and the upper electrode 40 are both transparent electrodes, one electrode is made of the aforementioned Ag—Mg alloy, while the other electrode is made of the aforementioned Ag—Mg alloy or a transparent conductive oxide. The transparent conductive oxide may be, for example, an indium tin oxide (ITO), an indium zinc oxide (IZO), or the like.

When only one of the lower electrode 20 or the upper electrode 40 is a transparent electrode, the transparent electrode may be made of the aforementioned Ag—Mg alloy, while the other is a reflective electrode made of an opaque conductor. The opaque conductor may be a metal, for example, aluminum (Al), copper (Cu), molybdenum (Mo), silver (Ag), an alloy thereof, or a combination thereof.

The emission layer 30 may be made of an organic material emitting one light among primary colors such as red, green, blue, or the like. Or, the emission layer 30 may be made of a mixture of an inorganic material with the organic material, for example, a polyfluorene derivative, a (poly)paraphenylenevinylene derivative, a polyphenylene derivative, a polyfluorene derivative, polyvinylcarbazole, a polythiophene derivative, or a compound prepared by doping these polymer materials with a perylene-based pigment, a cumarine-based pigment, a rothermine-based pigment, rubrene, perylene, 9,10-diphenylanthracene, tetraphenylbutadiene, Nile red, coumarin, quinacridone, or the like. In general, an organic light emitting diode device displays a desirable image by a combination of primary colors emitted by an emission layer therein.

The emission layer 30 may express a white light by combining three primary colors such as red, green, and blue. Specifically, the emission layer 30 may emit a white light by combining colors of neighboring sub-pixels or by combining laminated colors in a vertical direction.

An auxiliary layer 50 may be further included between the emission layer 30 and the upper electrode 40 to improve luminous efficiency. In FIG. 1, the auxiliary layer 50 is shown only between the emission layer 30 and the upper electrode 40 but the structure is not limited thereto, and may also be positioned between the emission layer 30 and the lower electrode 20, or both between the emission layer 30 and the upper electrode 40, and between the emission layer 30 and the lower electrode 20.

The auxiliary layer 50 may include an electron transport layer (ETL) and a hole transport layer (NTL) for balancing between electrons and holes, an electron injection layer (EIL) and a hole injection layer (HIL) for reinforcing injection of electrons and holes, or the like and may include one or more selected therefrom.

The auxiliary layer 50 may be an electron injection layer (EIL) and/or an electron transport layer (ETL) including Yb.

Yb has a relatively low work function and thus, relatively easily injects electrons into the emission layer 30 and also, has a low refractive index and a low light absorption in a visible ray region and thus, a high light transmittance, as aforementioned.

The Yb-containing auxiliary layer 50 may have a thickness of about 5 Å to about 50 Å. In some embodiments, when the Yb-containing auxiliary layer 50 has a thickness within the above described range, efficiency of an organic light emitting diode device is improved by increasing charge mobility as well as light transmittance.

The transparent electrode may form a microcavity with a reflective electrode. Accordingly, light emitted from the emission layer 30 is repetitively reflected between the transparent electrode and the reflective electrode separated from each other by a set (e.g., predetermined) gap, which may bring about strong interference effects and thus, amplify light of a specific wavelength region and increase efficiency of an organic light emitting diode device.

The following examples illustrate the present invention in more detail. These examples, however, are not in any sense to be interpreted as limiting the scope of this disclosure.

Formation of Transparent Thin Film

EXAMPLE 1-1

An Ag—Mg alloy thin film was formed to be 60 Å thick by thermally evaporating Ag and Mg in a ratio of 95:5 (vol %) on a glass substrate.

EXAMPLE 1-2

An Ag—Mg alloy thin film was formed to be 80 Å thick by thermally evaporating Ag and Mg in a ratio of 95:5 (vol %) on a glass substrate.

EXAMPLE 1-3

An Ag—Mg alloy thin film was formed to be 100 Å thick by thermally evaporating Ag and Mg in a ratio of 95:5 (vol %) on a glass substrate.

EXAMPLE 1-4

An Ag—Mg alloy thin film was formed to be 120 Å thick by thermally evaporating Ag and Mg in a ratio of 95:5 (vol %) on a glass substrate.

EXAMPLE 2-1

An Ag—Mg alloy thin film was formed to be 90 Å thick by thermally evaporating Ag and Mg in a ratio of 95:5 (vol %) on a glass substrate.

EXAMPLE 2-2

An Ag—Mg alloy thin film was formed to be 90 Å thick by thermally evaporating Ag and Mg in a ratio of 90:10 (vol %) on a glass substrate.

EXAMPLE 2-3

An Ag—Mg alloy thin film was formed to be 90 Å thick by thermally evaporating Ag and Mg in a ratio of 85:15 (vol %) on a glass substrate.

EXAMPLE 2-4

An Ag—Mg alloy thin film was formed to be 90 Å thick by thermally evaporating Ag and Mg in a ratio of 80:20 (vol %) on a glass substrate.

EXAMPLE 2-5

An Ag—Mg alloy thin film was formed to be 90 Å thick by thermally evaporating Ag and Mg in a ratio of 75:25 (vol %) on a glass substrate.

COMPARATIVE EXAMPLE 1

An Ag—Mg alloy thin film was formed to be 115 Å thick by thermally evaporating Ag and Mg in a ratio of 10:90 (vol %) on a glass substrate.

Evaluation: Light Transmittance, Light Reflectance, and Light Absorption Ratio

The Ag—Mg alloy thin films according to Examples 1-1 to 2-5 and Comparative Example 1 were measured regarding light transmittance, light reflectance, and light absorption. The measurement was performed by using UV-visible spectrophotometry.

The results are shown in FIGS. 2 to 7.

Figure 2:
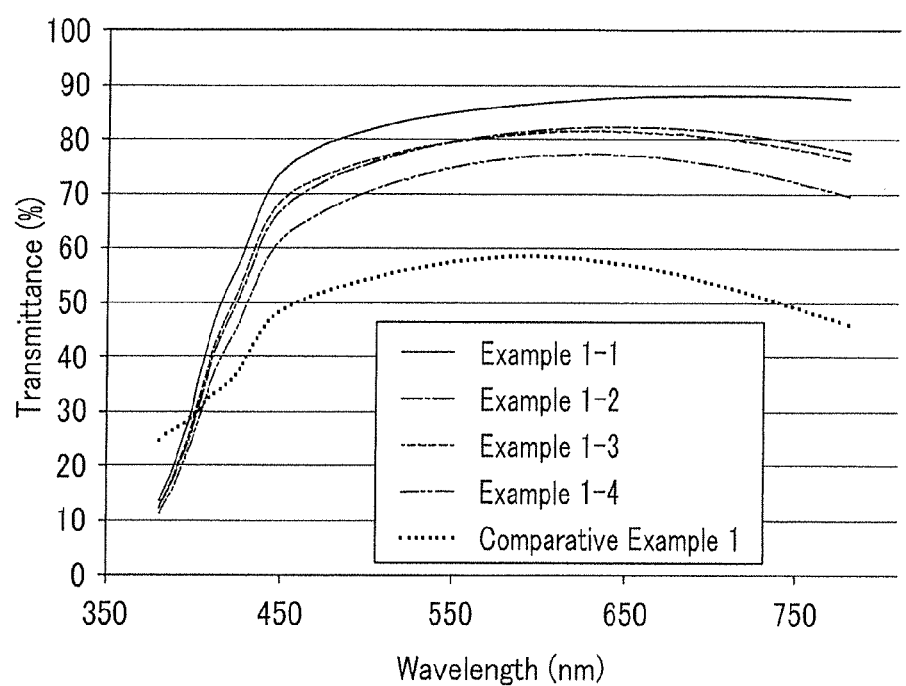
FIG. 2 is a graph of light transmittances of Ag—Mg alloy thin films according to Examples 1-1 to 1-4 and Comparative Example 1.
Figure 3:
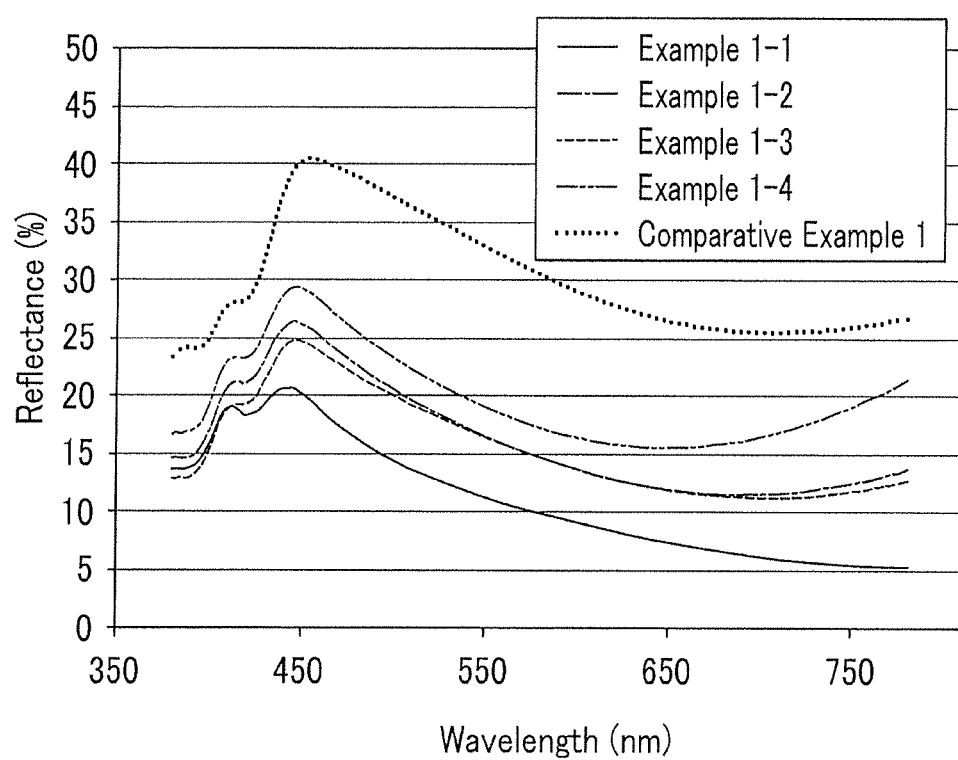
FIG. 3 is a graph of light reflectances of the Ag—Mg alloy thin films according to Examples 1-1 to 1-4 and Comparative Example 1.
Figure 4:
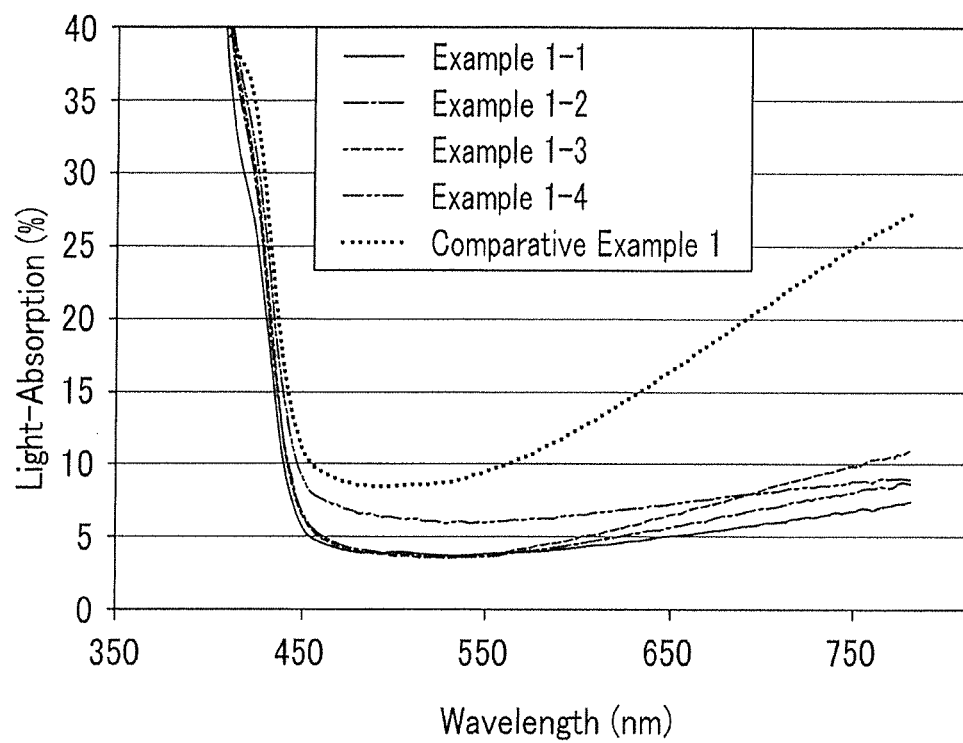
FIG. 4 is a graph of light absorptions of the Ag—Mg alloy thin films according to Examples 1-1 to 1-4.

FIG. 2 is a graph of light transmittances of the Ag—Mg alloy thin film according to Examples 1-1 to 1-4 and Comparative Example 1, FIG. 3 is a graph of light reflectances of the Ag—Mg alloy thin film according to Examples 1-1 to 1-4 and Comparative Example 1, FIG. 4 is a graph of light absorptions of the Ag—Mg alloy thin films according to Examples 1-1 to 1-4 and Comparative Example 1.

Figure 5:
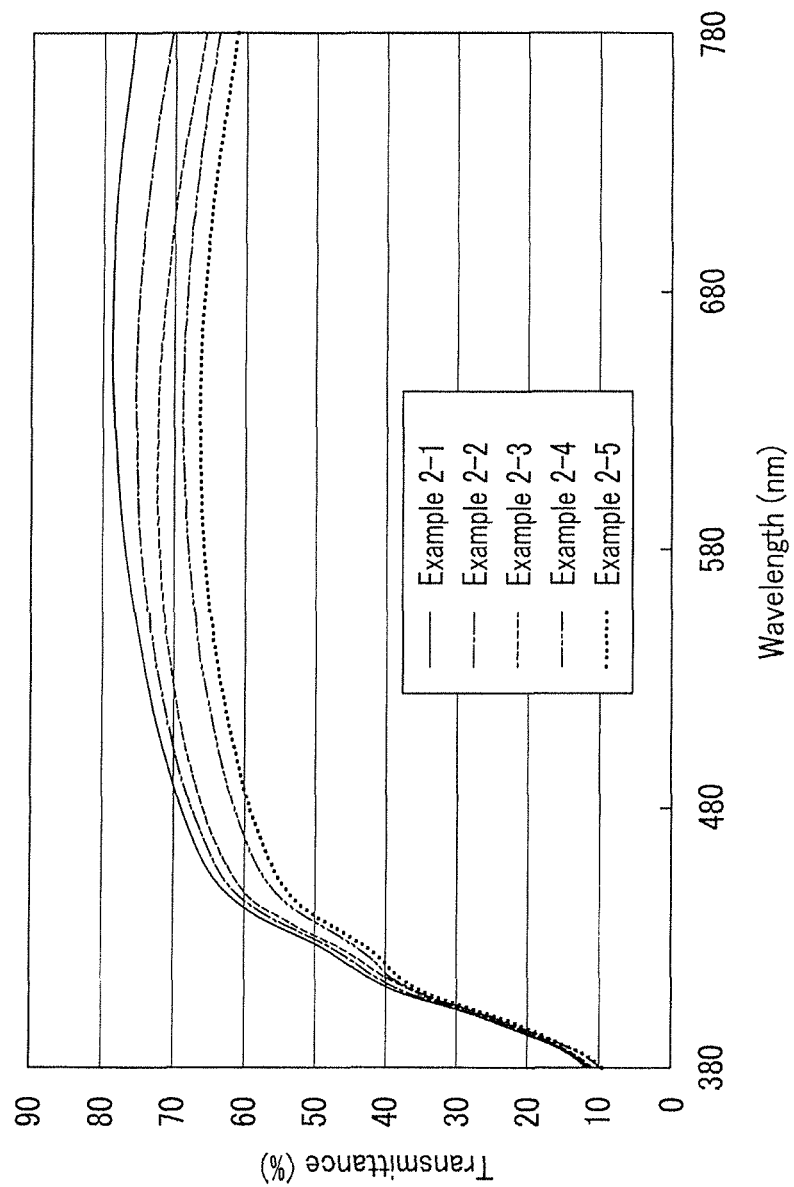
FIG. 5 is a graph of light transmittances of Ag—Mg alloy thin film according to Examples 2-1 to 2-5.
Figure 6:
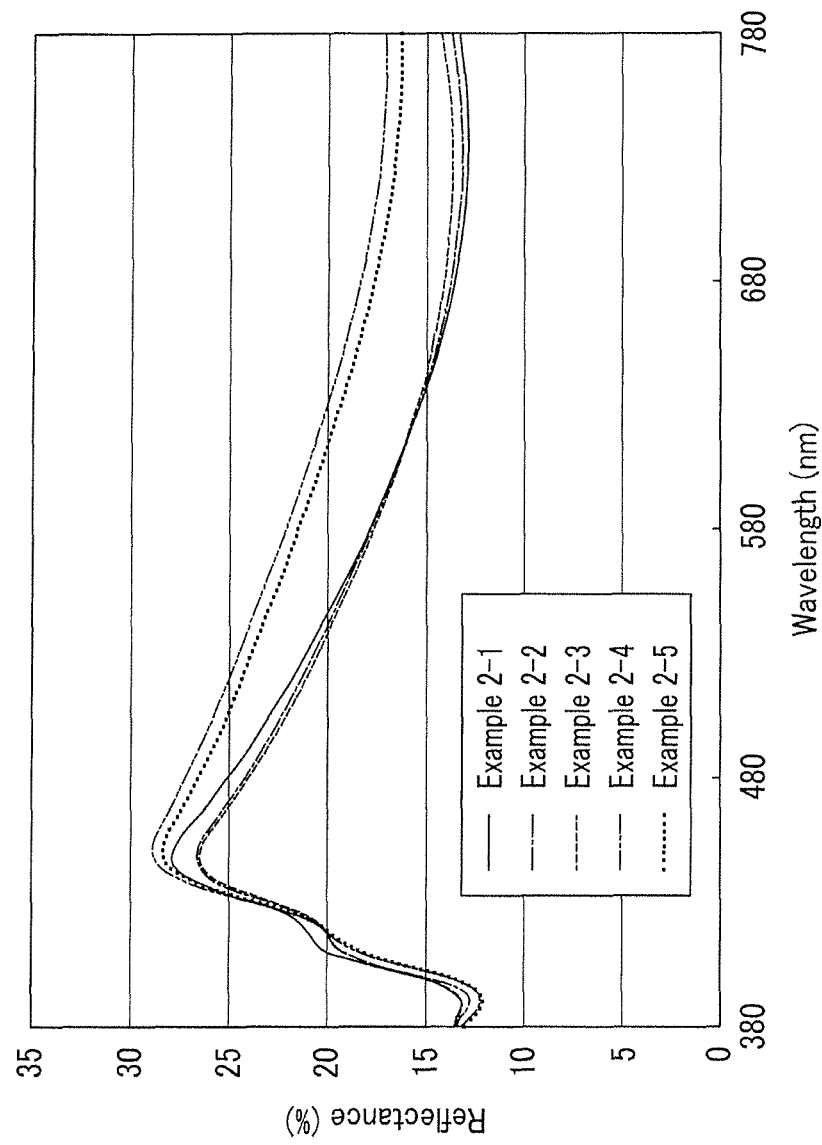
FIG. 6 is a graph of light reflectances of the Ag—Mg alloy thin films according to Examples 2-1 to 2-5.
Figure 7:
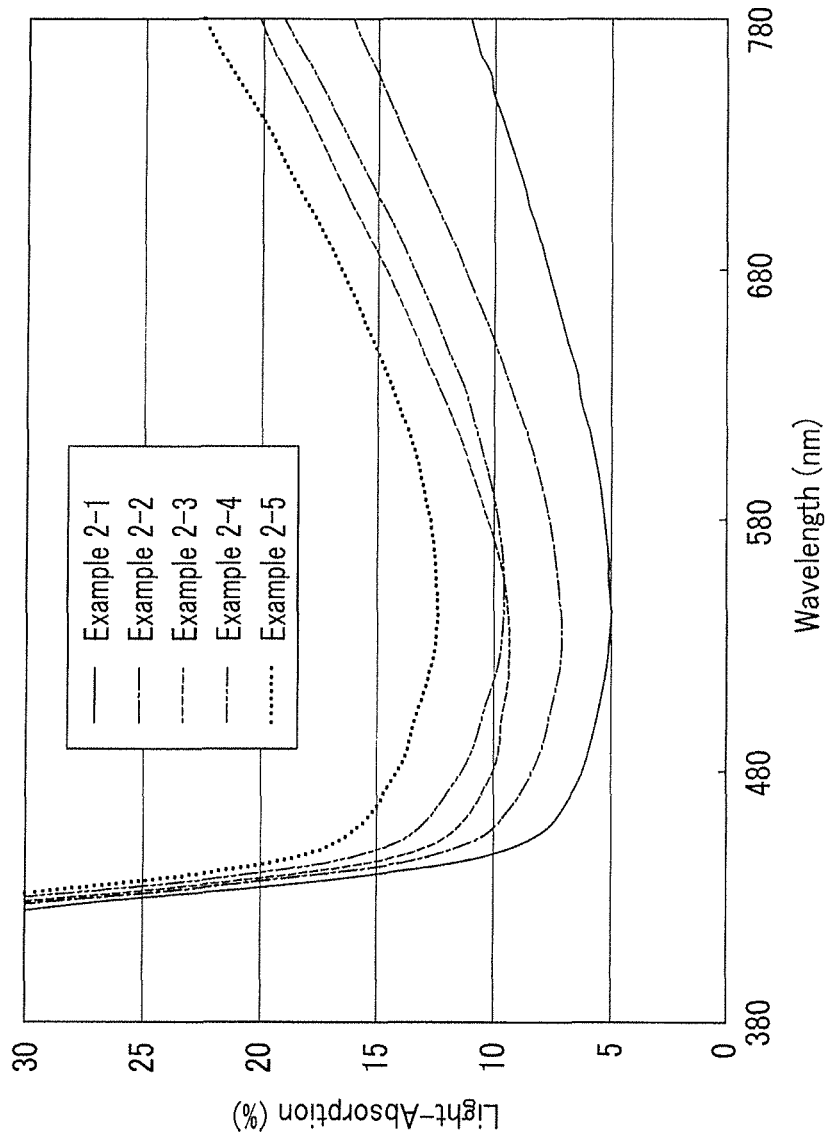
FIG. 7 is a graph of light absorptions of the Ag—Mg alloy thin film according to Examples 2-1 to 2-5.

FIG. 5 is a graph of light transmittances of the Ag—Mg alloy thin films according to Examples 2-1 to 2-5, FIG. 6 is a graph of light reflectances of the Ag—Mg alloy thin films according to Examples 2-1 to 2-5, and FIG. 7 is a graph of light absorptions of the Ag—Mg alloy thin films according to Examples 2-1 to 2-5.

Referring to FIGS. 2 to 4, the Ag—Mg alloy thin films according to Examples 1-1 to 1-4 had higher light transmittance and lower light reflectance and light absorption than the thin film according to Comparative Example 1.

The Ag—Mg alloy thin films according to Examples 1-1 to 1-4 were respectively used to form an electrode and thus, may improve light transmittance and also, decrease the amount of a light reflected or absorbed at the surface of the electrode and thus, improve efficiency of a display device.

In particular, the Ag—Mg alloy thin films according to Examples 1-1 to 1-4 had light transmittance of greater than or equal to about 75% at a wavelength of about 550 nm, a light reflectance of less than or equal to about 30% and a light absorption of less than or equal to about 12% in a wavelength region ranging from about 450 nm to 750 nm.

On the other hand, referring to FIGS. 5 to 7, the Ag—Mg alloy thin films according to Examples 2-1 to 2-5 had light transmittance of greater than or equal to about 60% at a wavelength of about 550 nm and a light reflectance of less than or equal to about 30% and a light absorption of less than or equal to about 15% in a wavelength region ranging from about 450 nm to 750 nm.

Fabrication of Organic Light Emitting Diode

EXAMPLE 3-1

An ITO anode was sputtered on a glass substrate and patterned. Next, an emission layer was formed by sequentially depositing a triphenylamine derivative as a red light emitting material, a perylene derivative as a blue light emitting material, and a fluorene derivative as a green light emitting material on the patterned ITO anode and then, depositing lithium quinolate thereon to form an electron transport layer (ETL). Then, Yb was deposited to be 15 Å thick, and a mixture of Ag and Mg in a ratio of 95:5 (vol %) was thermally evaporated thereon to form an 80 Å thick cathode made of Ag—Mg alloy, fabricating an organic light emitting diode.

EXAMPLE 3-2

An organic light emitting diode was fabricated according to the same method as Example 3-1 except for using a Ag—Mg alloy cathode made by providing Ag and Mg in a ratio of 90:10 vol %.

EXAMPLE 3-3

An organic light emitting diode was fabricated according to the same method as Example 3-1 except for using a Ag—Mg alloy cathode made by providing Ag and Mg in a ratio of 85:15 vol %.

EXAMPLE 3-4

An organic light emitting diode was fabricated according to the same method as Example 3-1 except for using a Ag—Mg alloy cathode made by providing Ag and Mg in a ratio of 80:20 vol %.

EXAMPLE 3-5

An organic light emitting diode was fabricated according to the same method as Example 3-1 except for using a Ag—Mg alloy cathode made by providing Ag and Mg in a ratio of 70:30 vol %.

COMPARATIVE EXAMPLE 2

An organic light emitting diode was fabricated according to the same method as Example 3-1 except for using a Ag—Mg alloy cathode made by providing Ag and Mg in a ratio of 10:90 vol %.

COMPARATIVE EXAMPLE 3

An organic light emitting diode was fabricated according to the same method as Example 3-1 except for using a Ag—Mg alloy cathode made by providing Ag and Mg in a ratio of 40:60 vol %.

Evaluation: Efficiency of Organic Light Emitting Diode

The organic light emitting diodes according to Examples 3-1 to 3-5 and Comparative Example 2 were evaluated regarding white luminous efficiency. The efficiency was measured by setting a color coordinate and using a luminance meter (CA210, manufactured by Minota Co., Ltd.) in units of Cd/A.

The results are provided in Table 1.

TABLE 1

| | White luminous efficiency (Cd/A) | Increased efficiency (%) (relative to Comparative Example 2) |
|---|---|---|
| Example 3-1 | 29.4 | 14.6 |
| Example 3-2 | 29.1 | 13.3 |
| Example 3-3 | 28.8 | 12.4 |
| Example 3-4 | 28.4 | 10.8 |
| Example 3-5 | 27.2 | 6.1 |
| Comparative Example 2 | 25.6 | 0 |
| Comparative Example 3 | 25.1 | −2.0 |

Referring to Table 1, the organic light emitting diodes according to Examples 3-1 to 3-5 had about 5% to about 15% better efficiency than the ones according to Comparative Examples 2 and 3.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

What is claimed is:

1. An organic light emitting diode device, comprising:
a first electrode,
a second electrode opposite the first electrode,
an emission layer between the first and second electrodes, and
an auxiliary layer between the first electrode and the emission layer,
wherein the first electrode comprises a Ag—Mg alloy including a greater amount of Ag than Mg,
wherein the second electrode comprises a reflective electrode,
wherein the first electrode has a thickness of about 60 Å to about 120 Å,
wherein the Mg is included in a range of about 5 volume % to about 15 volume % based on the total volume of the Ag—Mg alloy,
wherein the auxiliary layer consists of Yb,
wherein the Ag—Mg alloy of the first electrode is directly on the Yb of the auxiliary layer, and
wherein the auxiliary layer has a thickness of about 5 Å to about 50 Å.

2. The organic light emitting diode device of claim 1, wherein the first electrode further comprises Yb, and the Yb is included in an amount of less than or equal to 30 volume % based on the total volume of the Ag—Mg alloy.

3. The organic light emitting diode device of claim 1, wherein the Yb is included in a range of about 5 volume % to about 30 volume % based on the total volume of the Ag—Mg alloy.

4. The organic light emitting diode device of claim 1, wherein the first electrode has a light transmittance of greater than or equal to about 60% in a wavelength region of about 450 nm to about 750 nm.

5. The organic light emitting diode device of claim 1, wherein the first electrode has a light transmittance in a range of about 60% to 85% in a wavelength region of about 450 nm to about 750 nm.

6. The organic light emitting diode device of claim 1, wherein the first electrode has a light reflectance of less than or equal to about 40% in a wavelength region of about 450 nm to about 750 nm.

7. The organic light emitting diode device of claim 1, wherein the first electrode has a light absorption of less than or equal to about 15% in a wavelength region of about 450 nm to about 750 nm.

8. The organic light emitting diode device of claim 1, wherein the emission layer is configured to emit white light.

9. The organic light emitting diode device of claim 1, wherein the first electrode is formed in a single layer.

10. The organic light emitting diode device of claim 1, wherein the first electrode is a cathode.

11. The organic light emitting diode device of claim 1, wherein the reflective electrode of the second electrode comprises at least one of Al, Cu, Mo, and Ag.

12. The organic light emitting diode device of claim 1, wherein the Mg is included in a range of about 10 volume % to about 15 volume % based on the total volume of the Ag—Mg alloy.

13. The organic light emitting diode device of claim 1, wherein the auxiliary layer has a thickness of about 5 Å to about 35 Å.

\* \* \* \* \*